US010396780B2

(12) United States Patent
Birkbeck

(10) Patent No.: US 10,396,780 B2
(45) Date of Patent: *Aug. 27, 2019

(54) HIGH FREQUENCY PHASE SHIFTER USING LIMITED GROUND PLANE TRANSITION AND SWITCHING ARRANGEMENT

(71) Applicant: pSemi Corporation, San Diego, CA (US)

(72) Inventor: John Birkbeck, New Milton (GB)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/058,907

(22) Filed: Aug. 8, 2018

(65) Prior Publication Data
US 2019/0081626 A1    Mar. 14, 2019

Related U.S. Application Data

(63) Continuation of application No. 15/651,811, filed on Jul. 17, 2017, now Pat. No. 10,075,159.

(51) Int. Cl.
| | |
|---|---|
| *H03H 11/16* | (2006.01) |
| *H03K 5/13* | (2014.01) |
| *H03K 17/693* | (2006.01) |
| *H01P 3/02* | (2006.01) |
| *H03K 5/01* | (2006.01) |
| *H01P 1/10* | (2006.01) |
| *H01P 1/18* | (2006.01) |
| *H03K 5/00* | (2006.01) |

(52) U.S. Cl.
CPC ............ *H03K 17/693* (2013.01); *H01P 1/10* (2013.01); *H01P 1/184* (2013.01); *H01P 3/026* (2013.01); *H03K 5/01* (2013.01); *H03K 2005/00286* (2013.01)

(58) Field of Classification Search
CPC ........... H03K 5/13; H03K 2005/00052; H03K 2005/00286; H03L 7/0814; H03L 7/0812
USPC ............................ 327/231, 256–258; 333/164
See application file for complete search history.

(56) References Cited

U.S. PATENT DOCUMENTS

| | | | | |
|---|---|---|---|---|
| 5,424,696 | A * | 6/1995 | Nakahara | H01P 1/185 333/156 |
| 5,680,079 | A * | 10/1997 | Inami | H01P 1/185 333/161 |
| 8,283,991 | B1 * | 10/2012 | Essenwanger | H01P 5/10 333/238 |
| 9,112,254 | B2 * | 8/2015 | Cisco | H01P 1/18 |

(Continued)

FOREIGN PATENT DOCUMENTS

JP          2001177303 A  *  6/2001

OTHER PUBLICATIONS

Tra, Anh Quan, Notice of Allowance received from the USPTO dated Jul. 16, 2018 for U.S. Appl. No. 15/651,811, 8 pgs.

*Primary Examiner* — Anh Q Tra
(74) *Attorney, Agent, or Firm* — Jaquez Land Greenhaus LLP; Alessandro Steinfl, Esq.

(57) ABSTRACT

Designing phase shifters having small insertion loss and footprint for mm-wave applications is challenging. The disclosed methods and devices provide solutions to overcome such challenge. Devices based on limited ground coplanar waveguide structure are also disclosed wherein the 180° phase shift is created using through and changeover mm-wave switches.

21 Claims, 11 Drawing Sheets

(56) References Cited

U.S. PATENT DOCUMENTS

| 10,075,159 B1 | 9/2018 | Birkbeck | |
|---|---|---|---|
| 2008/0197936 A1* | 8/2008 | Berg | H03H 7/20 333/103 |
| 2010/0231325 A1* | 9/2010 | Hauhe | H01P 1/12 333/161 |

* cited by examiner

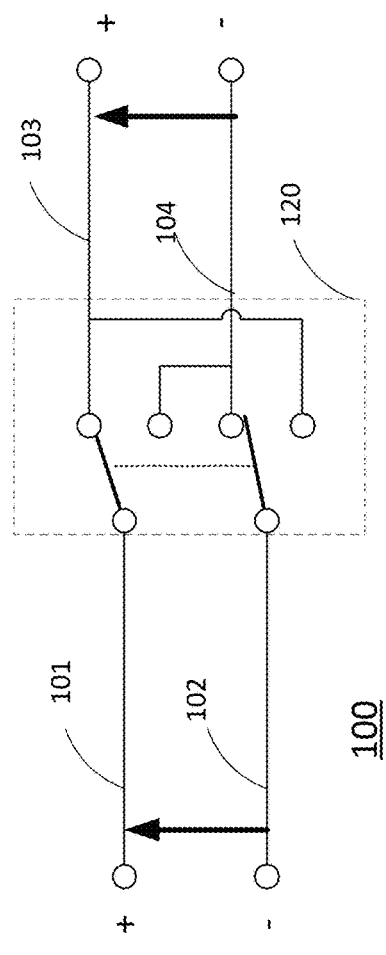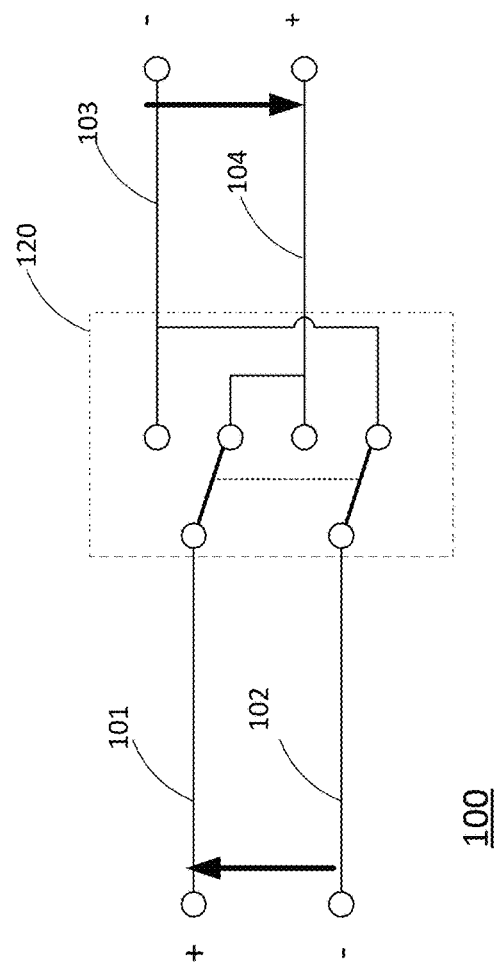

600

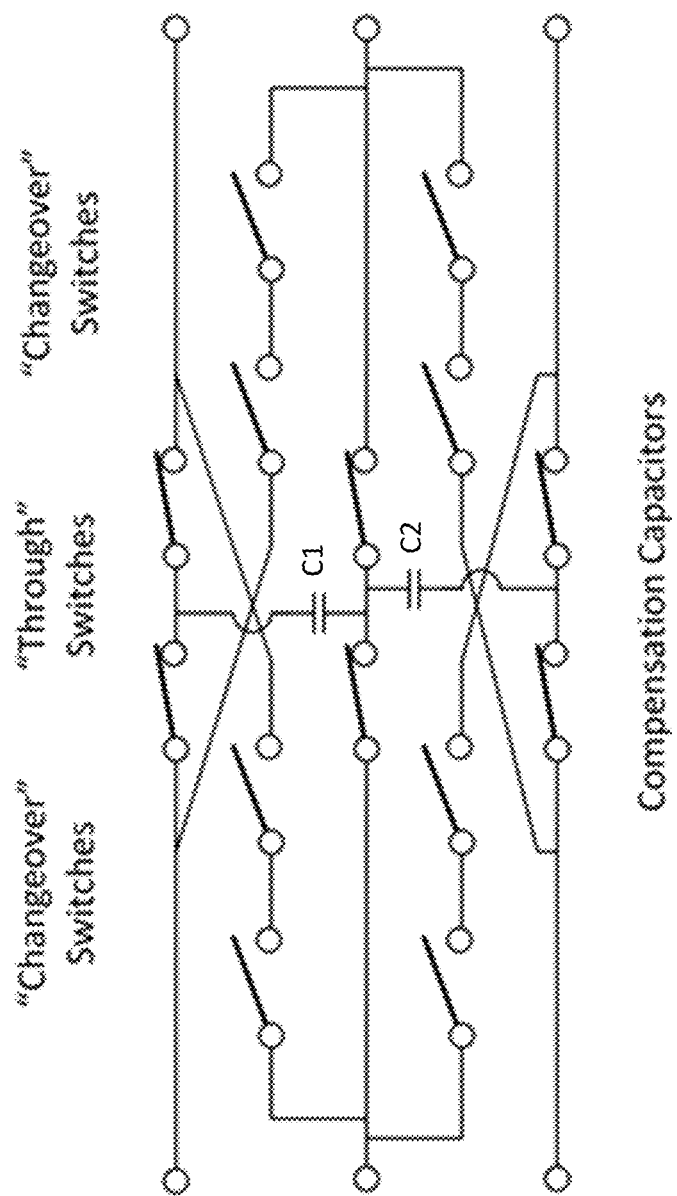

HIGH FREQUENCY PHASE SHIFTER USING LIMITED GROUND PLANE TRANSITION AND SWITCHING ARRANGEMENT

CROSS REFERENCE TO RELATED APPLICATIONS—CLAIM OF PRIORITY

This application is a continuation of commonly owned and co-pending U.S. patent application Ser. No. 15/651,811 filed Jul. 17, 2017, entitled "High Frequency Phase Shifter Using Limited Ground Plane Transition and Switching Arrangement", the disclosure of which is incorporated herein by reference in its entirety.

BACKGROUND

(1) Technical Field

The present disclosure is related to microwave and millimeter wave (mm-wave) phase shifters, and more particularly to methods and apparatus for mm-wave phase shifting using limited ground coplanar waveguides (LGCPW) and mm-wave switches.

(2) Background

Generating phase shift in a signal is required in certain mm-wave communications systems. As an example, in beamforming applications wherein several antennas are used, there is a need to feed to (or combine from) each of these antennas with different phases of the same signal. In such applications, various phase shifters are designed to generate phase shifts such as 180°, 90°, 45° etc. A combination of such phase shifters is then used to generate desired phase shifts anywhere from zero to 360°. Design of phase shifters using Lange couplers is known in the art and such designs have proven to generate accurate results. However, Lange couplers consume relatively large areas and their insertion loss is high. Similar drawbacks exist for switched filter based phase shifters.

FIGS. 1A-1B show the concept of a known method typically used to generate 180° phase shift. The circuit 100 comprises a changeover switch 120 driven by a differential signal introduced through signal conductors 101 and 102. When the changeover switch 120 is in a through position as shown in FIG. 1A, the positive differential signal conductor 101 is connected to a corresponding conductor 103 and the negative differential signal conductor 102 is connected to conductor 104 so that the input signal is passed without phase inversion. By switching the changeover switch 120 to a changeover position as shown in FIG. 1B, the positive and negative differential signal conductors are swapped and therefore, the incoming signal will experience a 180° phase shift. In typical mm-wave application and at higher frequencies, a single ended signal is carried by a trace and the other line would be a ground plane and therefore, this method is not practical and cannot be used. The single ended signal has to be first converted to a differential/balanced signal. Conversion of a single ended signal to differential signal in mm-wave frequencies typically requires transformers. The issue with such approach is the high loss and physical area requirement of transformers. Another way is to use balanced amplifiers with one input port connected to the input signal and the other input port grounded, but that would require supplying direct current (DC) power to bias the transistors. Such a DC overhead is highly undesirable from a power budget perspective.

In view of above, 180° phase shifters having smaller insertion loss and footprint compared to existing solutions are needed when designing mm-wave circuits and systems operating at mm-wave frequencies.

SUMMARY

Design of mm-wave phase shifters meeting stringent space and insertion loss requirements is challenging. Methods and devices taught in the present disclosure provide solutions to this problem. More in particular, disclosed devices have smaller size and footprint compared to existing solutions. According to a first aspect of the present disclosure, a switching arrangement is disclosed comprising: a first inner signal conductor, a first outer conductor and a second outer conductor; a second inner signal conductor, a third outer conductor and a fourth outer conductor; a signal input; and a signal output; wherein: (a) the switching arrangement is configured to receive a differential input signal from the signal input, and (b) the switching arrangement is configured to exhibit: (i) a through state, wherein the switching matrix is configured to connect the first inner signal conductor to the second inner signal conductor, the first outer conductor to the third outer conductor and the second outer conductor to the fourth outer conductor, thereby configuring the switching arrangement to pass the differential input signal through; and (ii) a changeover state, wherein the switching matrix is configured to connect the first inner signal conductor to both the third outer conductor and the fourth outer conductor, and to connect the second inner signal conductor to both the first outer conductor and the second outer conductor, thereby configuring the switching arrangement to output a differential output signal to the signal output, the differential output signal being the differential input signal with a phase shift.

According to a second aspect of the present disclosure, an electronic arrangement is disclosed comprising: (a1) an input section comprising a signal input, a first input ground plane and a second input ground plane; (a2) a first middle section and a second middle section; (a3) a switching matrix; (a4) an output section comprising a signal output, a first output ground plane and a second output ground plane; (a5) a first signal trace extending from the input section to the first middle section and connecting the signal input with the switching matrix; and (a6) a second signal trace extending from the second middle section to the output section and connecting the switching matrix to the signal output; wherein: (b1) the first middle section comprises a first limited ground plane and a second limited ground plane, the first limited ground plane and the second limited ground plane extending on opposite sides of the first signal trace and connecting the first input ground plane and the second input ground plane to the switching matrix respectively; (b2) the second middle section comprises a third limited ground plane and a fourth limited ground plane, the third limited ground plane and the fourth limited ground plane extending on opposite sides of the second signal trace and connecting the first output ground plane and the second output ground plane to the switching matrix respectively; (b3) proceeding from the input section to the first middle section, the first input ground plane is tapered down into the first limited ground plane and the second input ground plane is tapered down into the second limited ground plane; (b4) proceeding from the output section to the second middle section, the first output ground plane is tapered down into the third limited ground plane and the second output ground place is tapered down into the fourth limited ground plane. (b5) the electronic arrangement is configured to receive an input signal, and (b6) the electronic arrangement is configured to exhibit: (i) a through state, wherein the switching matrix is configured to connect the first signal trace to the second signal trace, the first limited ground plane to the third limited ground plane and the second limited ground plane to the fourth limited ground plane, thereby configuring the electronic arrangement to pass the input signal through; and (ii) a changeover state; wherein the switching matrix is configured to connect the first signal trace to both the third limited ground plane and the fourth limited ground plane, and to connect the second signal trace to both the first limited ground plane and the second limited ground plane, thereby configuring the electronic arrangement to create a 180° phase shift to the input signal.

According to a third aspect of the present disclosure, a method of creating phase shift in a signal is disclosed, comprising: providing a limited ground coplanar wave guide (LGCPW) comprising: a signal trace; a first limited ground plane and a second limited ground plane, the first limited ground plane and the second limited ground plane extending in parallel on opposite sides of the signal trace; feeding the LGCPW by the signal thereby generating a signal current in the signal trace and return currents in the first limited ground plane and the second limited ground plane; the signal current flowing in a first direction and the return currents flowing in a second direction, the second direction being opposite of the first direction; splitting the signal current into a first signal current and a second signal current; redirecting the first signal current into a third limited ground plane, the first signal current flowing in the first direction; redirecting the second signal current into a fourth limited ground plane, the second signal current flowing in the first direction; merging the return currents into a combined current, the combined current flowing in the signal trace in the second direction, thereby generating a phase shift in the signal.

DESCRIPTION OF THE DRAWINGS

FIGS. 1A-1B show the concept of a known method typically used to generate 180° phase shift.

FIG. 8 shows a switching arrangement using compensating capacitors, according to a further embodiment of the disclosure.

DETAILED DESCRIPTION

Throughout this paper the terms coplanar waveguide (CPW) and LGCPW are defined as follows:

CPW is a type of microwave transmission line realized on the surface of a dielectric medium. The signal conductor trace is flanked on either side by a conducting ground plane at some spacing distance. The ratio of the signal trace width to the ground spacing, together with the dielectric constant of the medium and the metal thickness are chosen to achieve the desired characteristic impedance of the transmission line, for example 50 ohms. From a design point of view, the ground planes are very wide compared to the signal trace width and ground spacing gap, such that they can be considered as infinite for the purposes of analysis. The dielectric is usually chosen to be of sufficient thickness such that the electromagnetic fields need only be considered to exist above and within the dielectric medium and do not extend out of the medium on the opposite surface to the signal and ground conductors.

LGCPW is considered as a variant of CPW wherein the flanking ground planes on the surface of the dielectric are narrowed to a width of similar order to that of the conductor trace width and spacing. As such, the ground planes are no longer considered as infinite from an analysis and design perspective, nevertheless any adjustment to the various widths and spacings to maintain the desired characteristic impedance may be relatively minor, due to the currents in the ground planes tending mostly to flow on the edges adjacent to the signal traces.

Figure 2A:
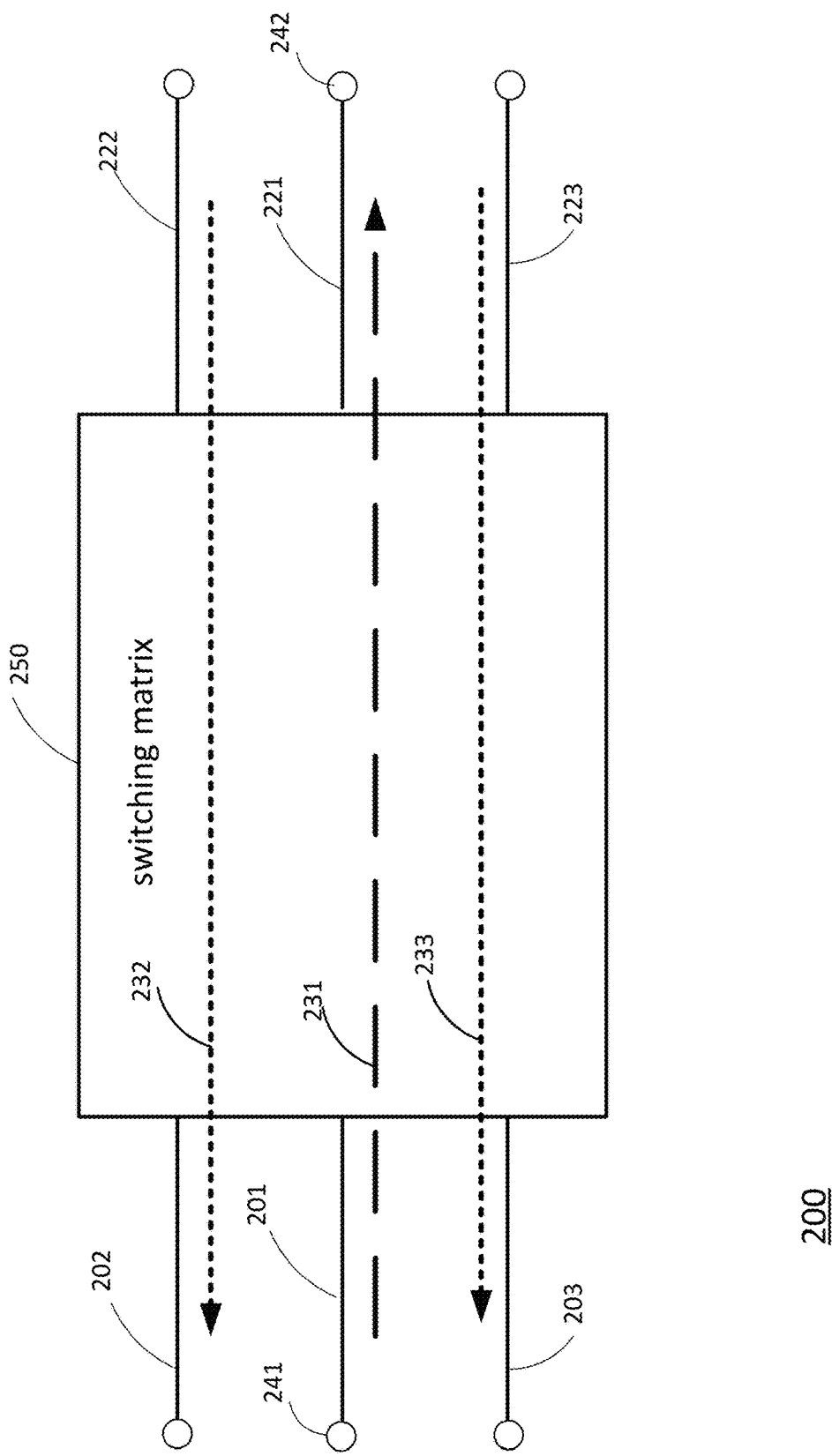
FIG. 2A shows a switching arrangement according to an embodiment of the disclosure, the switching arrangement being in a through state

FIG. 2A shows a switching arrangement 200 in accordance with an embodiment of the present disclosure. The switching arrangement 200 comprises a first inner signal conductor 201, a first outer conductor 202, a second outer conductor 203, a second inner signal conductor 221, a third outer conductor 222, a fourth outer conductor 223 and a switching matrix 250. The switching arrangement 200 further comprises a signal input 241 and a signal output 242.

Figure 2B:
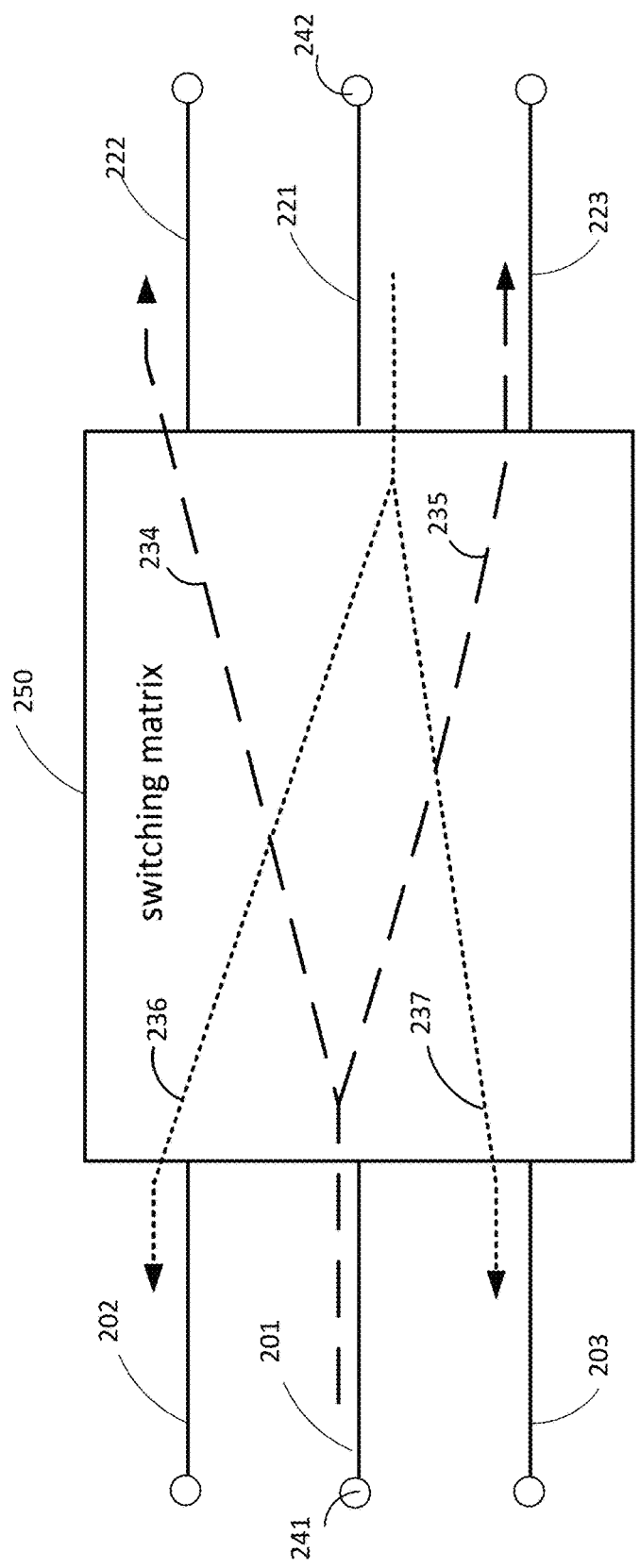
FIG. 2B shows a switching arrangement according to an embodiment of the disclosure, the switching arrangement being in a changeover state.

Referring to FIGS. 2A-2B, the switching arrangement 200 is configured to exhibit two states: a through state (as shown in FIG. 2A) and a changeover state (FIG. 2B). With further reference to FIG. 2A, in the through state, the switching matrix 250 is configured to connect the first inner signal conductor 201 to the second inner signal conductor 221 and the outer conductors 202, 203 to the outer conductors 222, 223 respectively. In the changeover state as shown in FIG. 2B, the switching matrix 250 is configured to connect the first inner signal conductor 201 to both the third outer conductor 222 and the fourth outer conductor 223 and to connect the second inner signal conductor 221 to both the first outer conductor 202 and the second outer conductor 203. In an operative condition, the switching arrangement 200 is configured to receive a differential signal carried by an inner signal conductor and a pair of outer conductors.

Referring to FIG. 2A, in an operative condition, when the switching arrangement 200 is the through state, the signal current flow through the inner signal conductors 201 and 221 in the direction shown by an arrow 231 and return currents corresponding to the signal current flow in the outer conductors 222, 223, 202, 203 in the direction shown by the arrows 232, 233.

Referring now to FIG. 2B, in an operative condition, when the switching arrangement 200 is in the changeover state, the signal current flowing in the inner signal conductor 201 is split in two, continuing to flow through both of the outer conductors 222, 223 in the direction of arrows 234, 235, and the return currents flowing in the outer conductors (202, 203) are merged into the signal conductor 221. In other words, the signal coming in, rather than going through the central part (through state) is now divided equally to what was the outer returns, in the through state, on the north and south side of the inner signal conductor 221. At the same time, the outer current returns on the left, now merge to the inner signal conductor 221 on the righthand side. Comparing the flow of the current signal and its associated return currents as shown in FIGS. 2A-2B, one can conclude that the incoming signal experiences a 180° phase shift when the switching arrangement 200 is in the changeover state. According to an embodiment of the present disclosure, the signal input 241 and the signal output 242 are 50Ω matched.

Figure 3A:
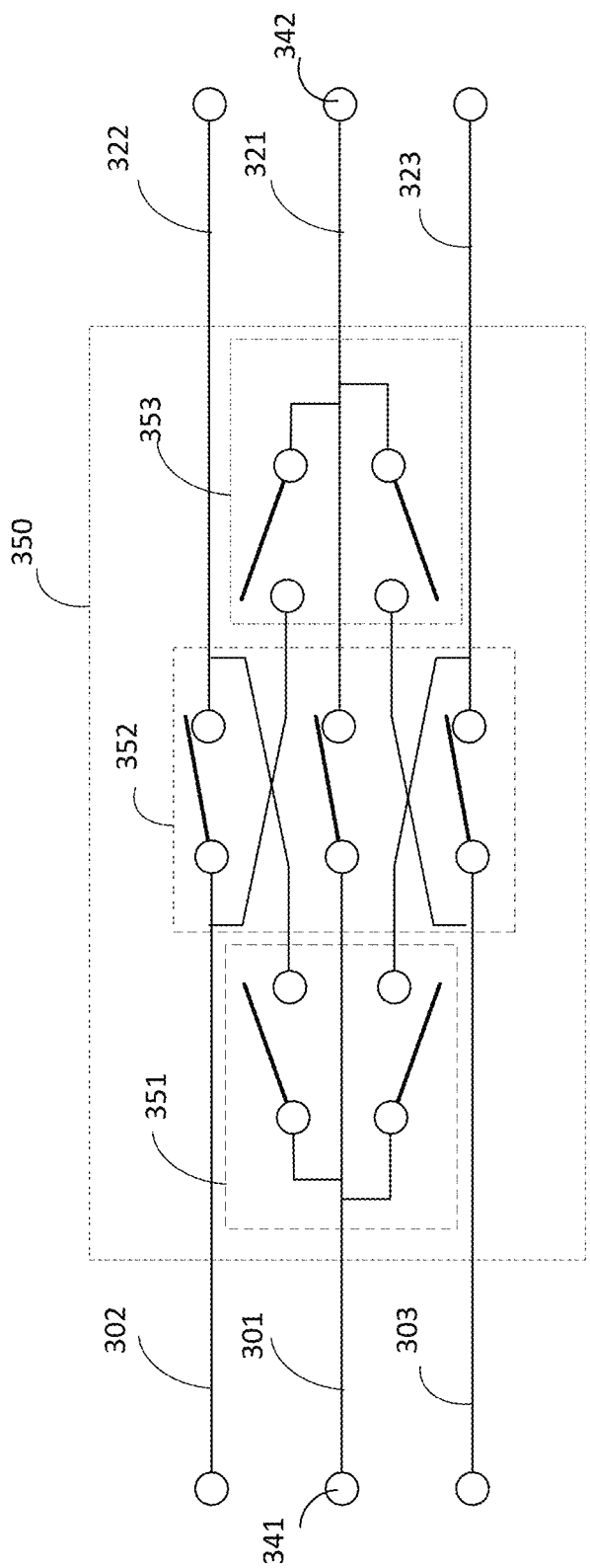
FIG. 3A shows a switching arrangement according to another embodiment of the disclosure.

FIG. 3A shows a switching arrangement 300 according to an embodiment of the disclosure. The switching arrangement 300 comprises a switching matrix 350, the switching matrix 350 comprising two changeover switches 351, 353 and a through switch 352. The principle of operation of the switching arrangement 300 is similar to what was described above with regards to the switching arrangement 200 of FIGS. 2A-2B. The switching matrix 350 is a specific implementation of the switching matrix 250. The switching arrangement 300 is configured to receive a differential signal and comprises a signal input 341 and a signal output 342 carried by a signal conductor and a pair of return conductors.

Figure 3B:
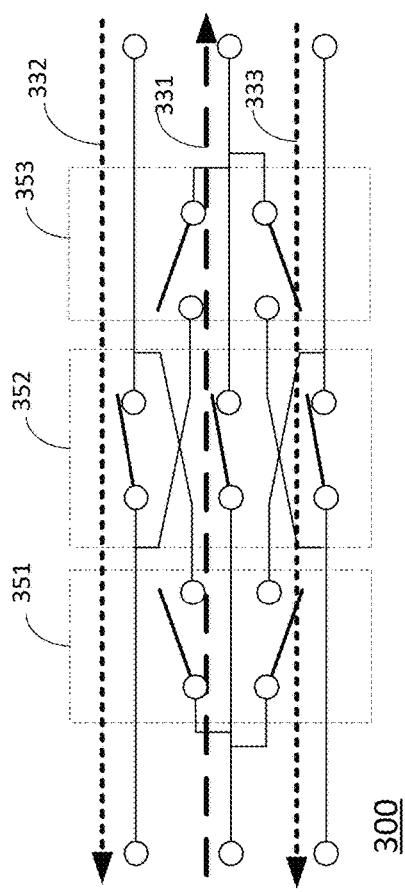
FIG. 3B shows the switching arrangement of FIG. 3A in the through state.

With reference to FIGS. 3A-3B, in an operative condition and when the switching arrangement 300 is in in the through state, the through switch 352 is closed and the changeover switches 351, 353 are open. As a result, the differential signal current flows through the middle (e.g., through inner signal conductors 301, 321) and in the direction of an arrow 331. Additionally, return currents flow in this state through outer conductors on top and bottom (e.g. outer conductors 302, 322, 303, 323) in opposite direction of the inner signal current, e.g. the direction indicated by arrows 332, 333.

Figure 3C:
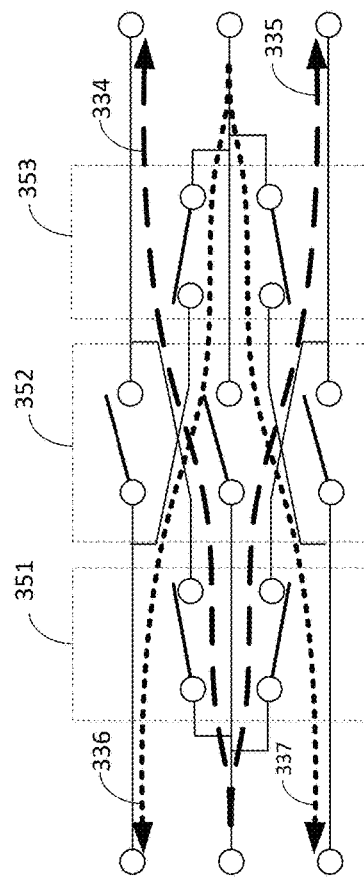
FIG. 3C shows the switching arrangement of FIG. 3A in the changeover state.

Referring now to FIGS. 3A and 3C, in an operative condition and when the switching arrangement 300 is in the changeover state, the through switch 352 is open and the changeover switches 351, 353 are closed. As a result, the inner signal current is now split in two currents flowing through top and bottom outer conductors (e.g. outer conductors 322, 323) and in the direction indicated by arrows 334, 335. Moreover, return currents in top and bottom conductors (e.g., outer conductors 302, 303) will merge to a combined current, the combined current flowing in the inner signal conductor 321 in the direction indicated by the arrows 336, 337. Based on what was described and comparing signal and return currents directions as shown in FIG. 3B-3C, a 180° phase shift is created when the switching arrangement 300 is in the changeover state. According to an embodiment of the present disclosure, the signal input 341 and the signal output 342 are 50Ω matched. In some embodiments, the switching arrangement 300 of FIG. 3A may be implemented in Silicon On Insulator (SOI), although without departing from the spirit and scope of the invention, other embodiments implemented in technologies other than SOI may also be envisaged. Referring back to FIGS. 2-3, feeding such switching arrangements with a differential signal current is highly desired. The person skilled in Art will understand that, for example in mm-wave applications, especially in higher frequencies, providing such a differential signal current as input to the switching arrangements of FIGS. 2-3 is a challenging task. Solutions to this problem based on the teachings of the present disclosure are described in below.

Figure 4:
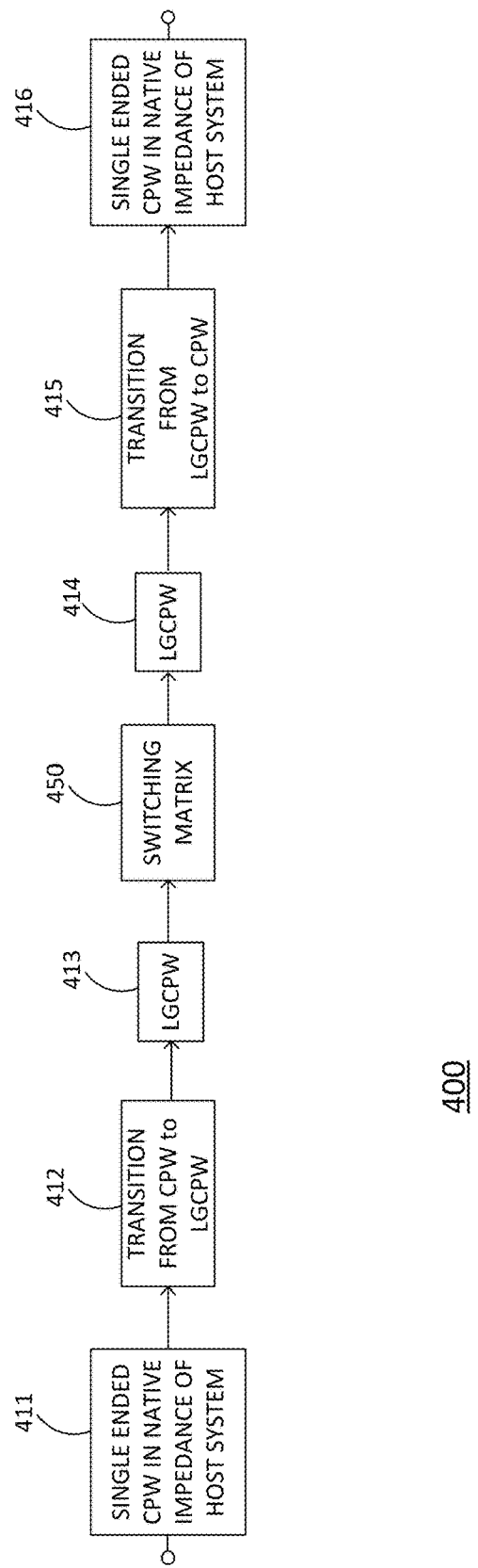
FIG. 4 shows an electronic arrangement in accordance with an embodiment of the disclosure.

FIG. 4 shows an exemplary electronic arrangement 400 in accordance with an embodiment of the present disclosure. The electronic arrangement 400 comprises a first CPW 411 in native impedance of a host system. A signal input to the first CPW 411 is a single ended signal. The electronic arrangement 400 further comprises a first transitioning block 412 wherein a CPW to LGCPW structure conversion occurs. The first transitioning block 412 is followed by a first LGCPW 413, the first LGCPW 413 providing a differential signal to an input of a switching matrix 450. Similar to what was explained previously with regards to FIGS. 2A-2B and FIGS. 3A-3C, depending on state of the switching matrix 450, the signal may pass through with no change (e.g. "through" state) or experience a phase shift (e.g. "changeover" state). The differential signal at an output of the switching matrix 450 will then travel through a second LGCPW 414 before being converted to a single ended signal after passing through a second transitioning block 415 wherein an LGCPW to CPW conversion occurs. The resulting single ended signal then flows through a second CPW 416 back into the host system. According to an embodiment of the present disclosure, one or more of the first CPW 411, the first LGCPW 413, the second LGCPW 414 and the second CPW 416 may have a characteristic impedance of 50Ω. In what follows, more details regarding implementation of various elements of the electronic arrangement 400 in accordance with the present disclosure will be discussed.

Figure 5:
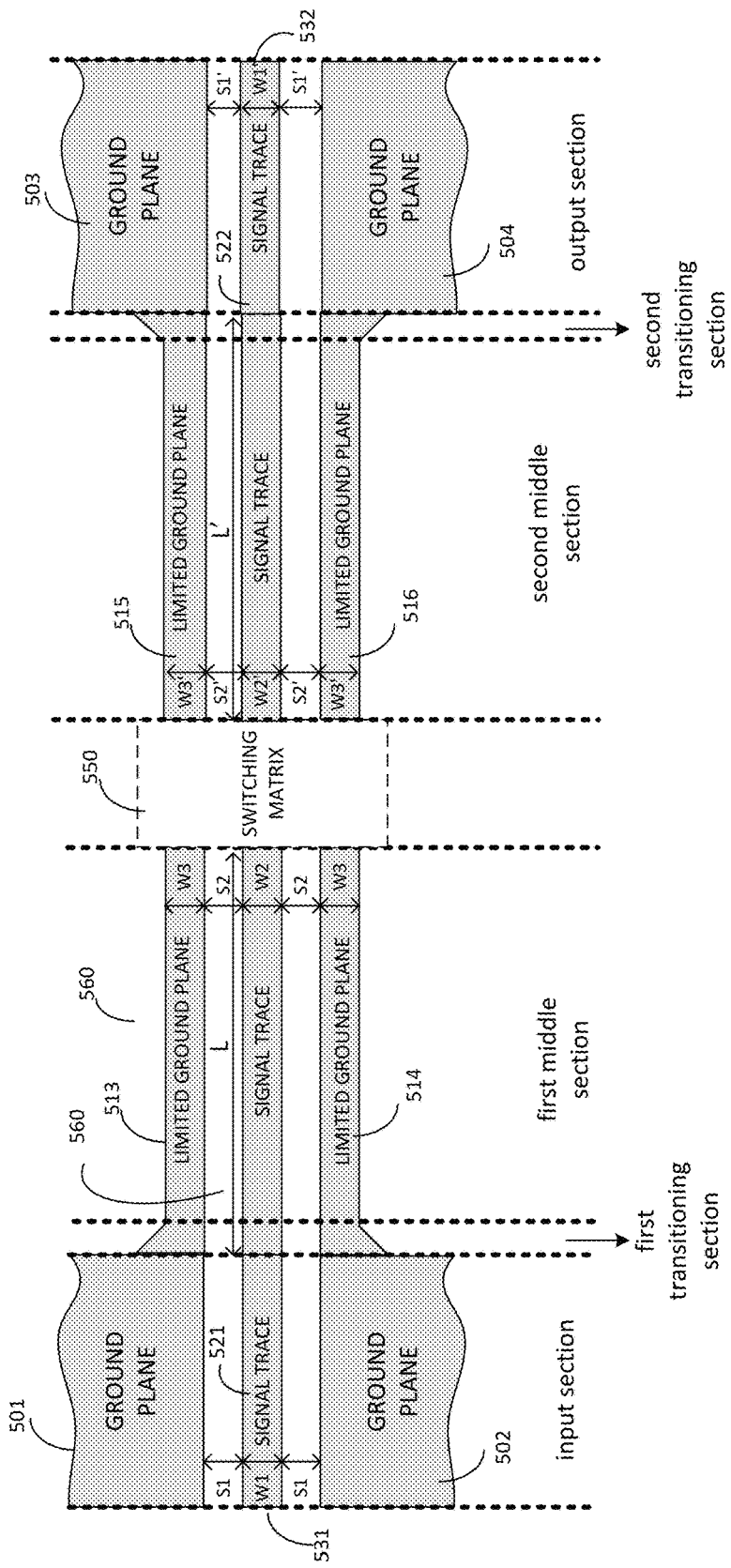
FIG. 5 shows an electronic arrangement according to a further embodiment of the disclosure.

FIG. 5 shows an electronic arrangement 500 according to an embodiment of the disclosure. The electronic arrangement 500 comprises an input section, a first middle section, a second middle section, a first and a second transitioning sections, and an output section. The input section is essentially a coplanar wave guide (CPW) comprising a signal input 531 and ground planes 501, 502. Similarly, the output section is also a CPW structure comprising a signal output 532 and ground planes 503, 504. The electronic arrangement 500 further comprises a first signal trace 521 and a second signal trace 522, the first signal trace 521 extending from the input section to the first middle section and connecting the signal input 531 to an input of a switching matrix 550, and the second signal trace 522 extending from the second middle section to the output section and connecting an output of the switching matrix 550 to the signal output 532 The first middle section is essentially an LGCPW structure comprising a portion of the first signal trace 521 and two limited ground planes 513, 514. Similarly, the second middle section is an LGCPW comprising a portion of the second signal trace 522 and limited ground planes 515, 516. As shown in FIG. 5, proceeding from the input section to the first middle section, ground planes 501, 502 are tapered down into limited ground planes 513, 514. In other words, a conversion from a single ended CPW to LGCPW structure occurs within the first transitioning section and as a result, a single ended input signal is converted into a differential signal entering the first middle section. Referring to the first transitioning section and first middle section of FIG. 5, according to an embodiment of the present disclosure, the length L should be sufficiently long such that a substantially balanced signal is set up at the input of the switching matrix 550. The length L may be a small fraction of a wavelength in according to a further embodiment of the disclosure. Good results have been measured upwards from the order of $1/10^{th}$ wavelength from the start of the transition to the input of the switching matrix. The person skilled in art will understand that a current flowing into the limited ground planes 513, 514 tends to stay near edges closer to the first signal trace 521 within the first middle section and as such, by implementing a proper CPW into LGCPW transition as described, there is no noticeable impact on ground currents flowing through limited ground planes 513, 514 although metal has been cut away from the ground planes 501, 502. By virtue of such transition from a CPW structure into an LGCPW structure as described above, a single ended input signal is converted into a differential signal, the differential signal being fed into the LGCPW structure within the first middle section.

Similar to what was explained with regards to the switching arrangement of FIGS. 2A-2B and FIGS. 3B-3C, the switching arrangement 500 of FIG. 5, is configured to exhibit either a "through" state or a "changeover" state. In an operative condition and when the electronic arrangement 500 is in the through state, the differential signal passes through the switching matrix 550 without experiencing phase shift. On the other hand, when operating in the changeover state, the differential signal current will experience a 180° phase shift according to the same concepts as disclosed previously. In either case, the differential signal at the output of the switching matrix 550 will travel a portion of the second signal trace 522 of the middle section before being converted back to a single ended signal after passing through the second transitioning section wherein a conversion from an LGCPW back to CPW occurs. A portion of the second signal trace 522 within a combination of the second middle section and the second transitioning section is of length L', the length L' may be equal to or different from the length L according to various embodiments of the present disclosure.

With reference to FIG. 5, the characteristic impedance of the input section is substantially determined by W1, S1, surrounding dielectric 560 and metalization thickness, assuming any other ground planes are relatively far away. As indicated in FIG. 5, W1 and S1 represent a width of the first signal trace 521 of the input section and spacing of ground planes (501, 502) from the first signal trace 521 of the input section, respectively. Same applies to impedance characteristics dependency of the output section on W1', S1' surrounding dielectric 560 and metallization thickness on the output section side wherein W1' and S1' represent, similarly, a width of the second signal trace 522 and spacing of ground planes 503, 504 from the second signal trace 522 within the output section. Referring to the input and output sections, embodiments according to the present disclosure may be made where the spacing of signal traces with corresponding ground places are different. Without departing from the scope and the spirit of the present disclosure, further embodiments may be designed where the widths W1 and W1' are same or different.

With further reference to FIG. 5, a characteristic impedance of the first middle section is substantially determined by W2, W3, S2, the surrounding dielectric 560 and the metalization thickness assuming any other ground planes are relatively far away. Making reference to the middle section and as indicated in FIG. 5, W2, W3 and S2 represent a width of the first signal trace 521, a width of limited ground planes 513, 514 and spacing of limited ground planes from the signal trace, respectively. Same applies to a characteristic impedance of the second middle section, this time using parameters W2', W3' and S2'. According to various embodiments of the disclosure, parameters W2 and W3 may be equal to or different from each other. Other embodiments may also be made wherein ground planes with different widths are implemented. Same design flexibilities as what was mentioned with respect to parameters W2, W3, and S2, also applies to parameters W2', W3' and S2'. In accordance with various embodiments of the disclosure, characteristic impedances of a) the input section, b) the first middle section, c) the second middle section and d) the output section may be equal to or different from one another. Indeed, some potentially useful tradeoffs with insertion loss are possible if impedance differences are allowed in design. According to an embodiment of the disclosure, each of said sections above has a characteristic impedance of 50Ω. According to another embodiment of the present disclosure, the switching arrangement 500 is symmetrical with respect to a point within the switching matrix 550.

With continuous reference to FIG. 5, some embodiments may be implemented wherein the switching matrix 550 comprises two changeover switches and one through switch similar to what was described with regards to the switching arrangement 300 of FIGS. 3A-3C. According to further embodiment of the disclosure the switching matrix 550 comprises MOSFETs, although different technologies may be used to implement the switching matrix 550. In some embodiments, the electronic arrangement 500 of FIG. 5 may be implemented in Silicon On Insulator (SOI), although without departing from the spirit and scope of the invention, other embodiments implemented in technologies other than SOI may also be envisaged. Embodiments implemented on SOI may be made to operate in a frequency range from a few GHz up to 100 GHz although other embodiments implemented in different technologies that are capable of operating in different frequency ranges is also possible. Furthermore, various embodiments of the invention may be implemented in waveguides other than CPW, such as microstrip or stripline, wherein infinite ground planes are tapered to limited ground sections such that distinct conductors are available to apply to a switch matrix.

As mentioned previously, there are applications wherein achieving a 180° phase shift together with stringent loss and footprint requirements may be challenging. An achieved phase shift and its associated bandwidth together with the insertion loss and match of the circuit in both states are tradeable parameters, being a function of many physical size variables and switch value choices. Different optimization approaches are possible to trade these performance parameters as required. An example of optimizing for phase shifts other than 180° phase shifts based on the disclosed teachings is given below.

Figure 6:
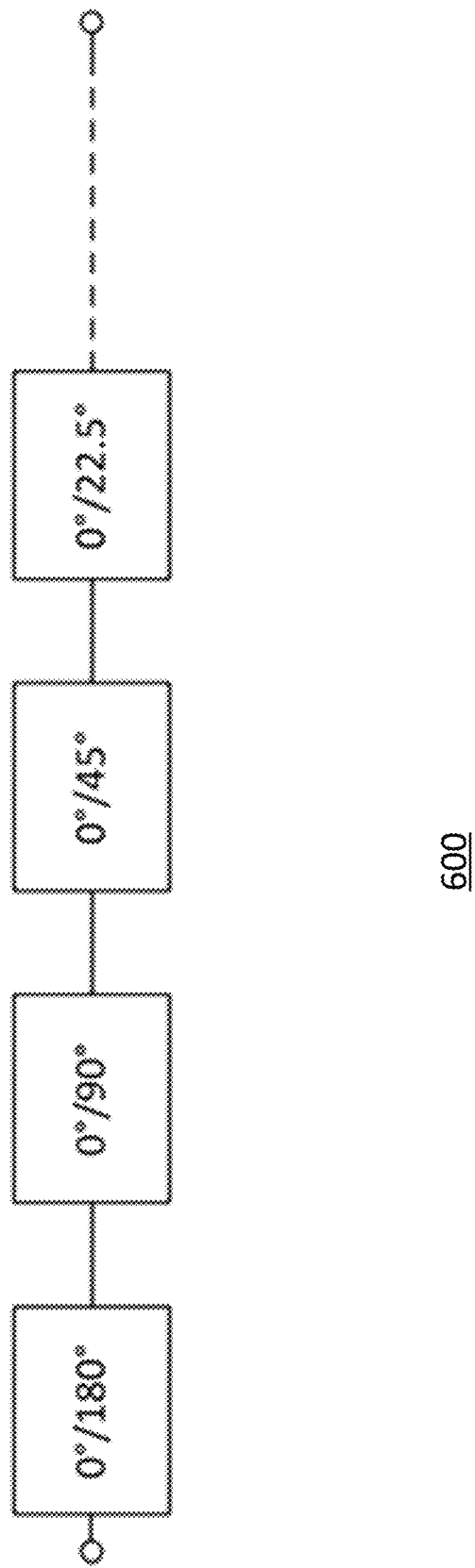
FIG. 6 shows 0/180° phase shifter used with a cascade of smaller phase shifts to give 360° coverage to a resolution set by the smallest bit.
Figure 7A:
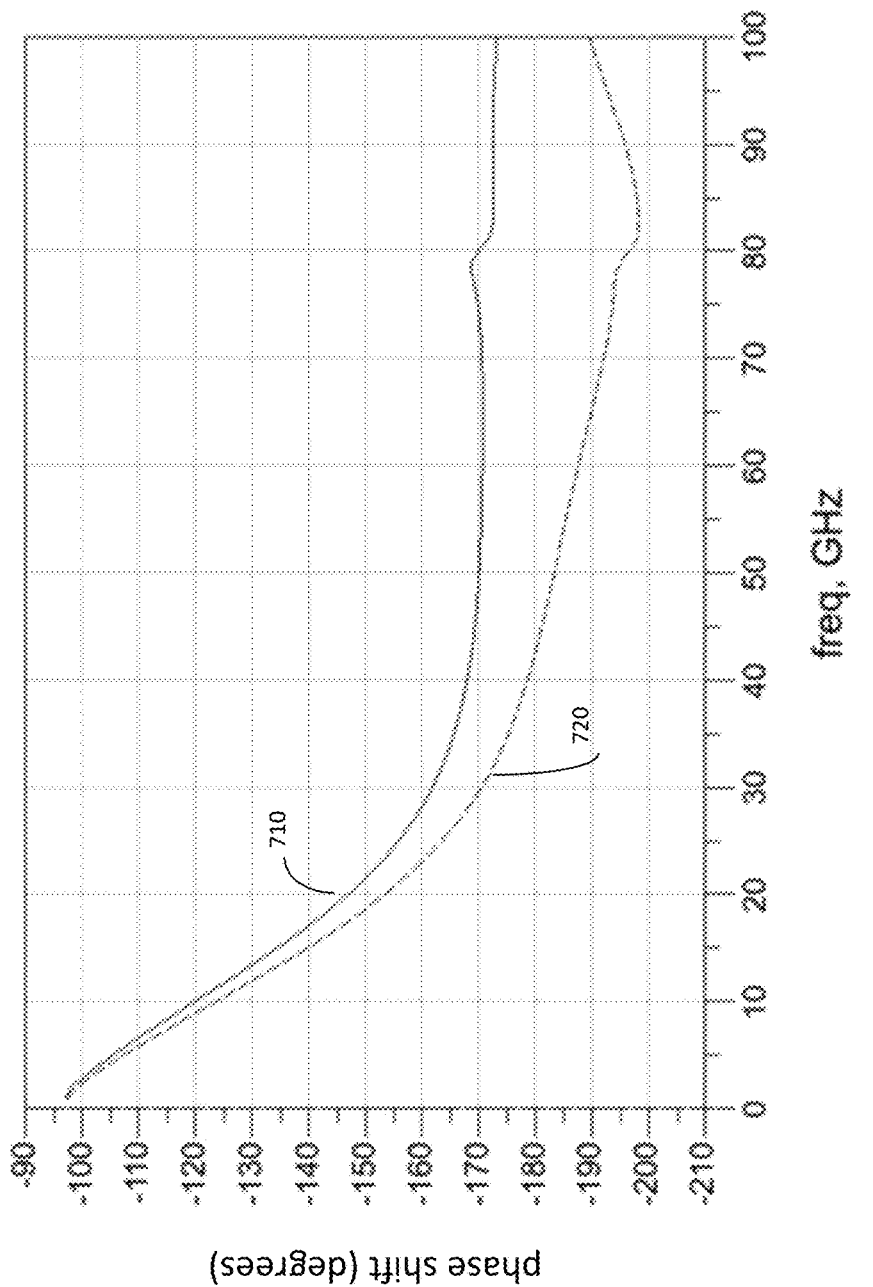
FIG. 7A shows two curves representing phase shift vs. frequency corresponding to an optimized and a non-optimized design according to an embodiment of the present disclosure.
Figure 7B:
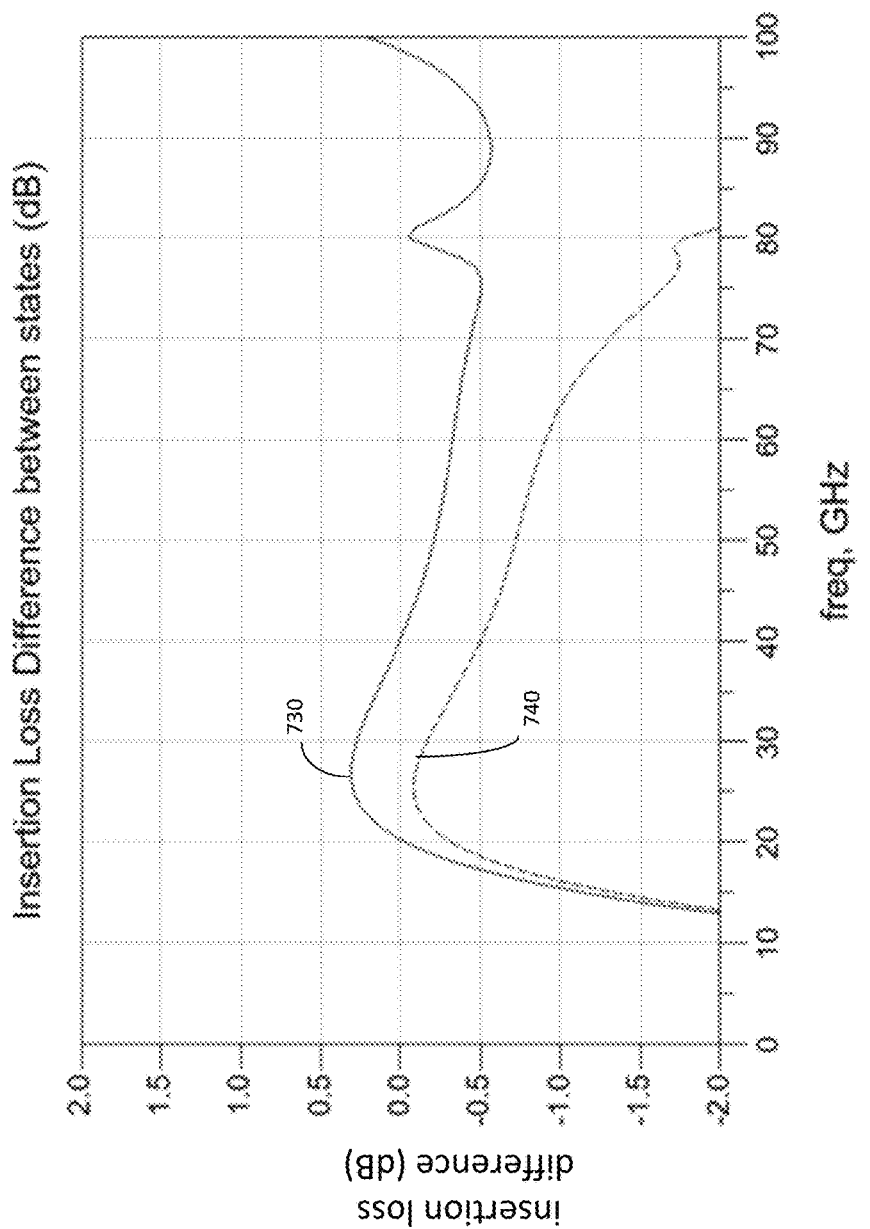
FIG. 7B shows two curves representing loss difference between states vs. frequency corresponding to an optimized and non-optimized design in accordance with an embodiment of the disclosure.

FIG. 6 shows 0/180° phase shifter used with a cascade of smaller phase shifts to give 360° coverage to a resolution set by the smallest bit. This is called a "binary coded" phase shift since each phase bit is half its predecessor. Although often desirable, it is not essential that each bit should be accurately binary weighted. FIG. 7A shows a phase shift (in degree) vs. frequency (in GHz) graph 700A wherein two curves 710, 720 are shown. The curve 720 corresponds to a design of the present disclosure wherein an accurate 180° response at around 40 GHz is achieved, however some slope on this response can be noted which may not be desirable for some applications with certain bandwidth requirement. The curve 710 corresponds to a different design wherein an optimization method in accordance with the present disclosure being applied. As can be noticed, a useable flat response extending from perhaps 30-70 GHz, although at 170° not 180°, has been achieved. In applications where such flat response with a 180° phase shift is required, a design such as the phase shifter of FIG. 6 can be implemented wherein the phase shifter of FIG. 6 is configured to top up the phase difference (e.g. a 10° phase difference for this case). This is not a problem within the whole system because one of the smaller phase shift sections (which are naturally less lossy) can be used to top up the missing phase. Referring now to FIG. 7B, curves 730 and 740 represent loss differences (between "through" and "changeover" states) in case of the above-mentioned optimized and non-optimized designs as a function of frequency, respectively. A smaller loss difference in the case of the optimized design can be noticed. FIG. 8 shows a switching matrix 800 similar to the switching matrix 350 of FIG. 3A wherein each of switches comprises a stack of 2 switches. Two compensating capacitors C1 and C2 have been implemented wherein such capacitors connect mid points of stack of 2 "through" switches on top and bottom to a midpoint of the stack of 2 "through" switches in the middle. The optimization method described with reference to graphs of FIGS. 7A-7B makes use of the switching matrix 800 of FIG. 8 to achieve the optimized results as described above.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

What is claimed is:
1. An electronic arrangement comprising:
a first electronic block;
a signal input and a signal output; and
a switching arrangement comprising:
a first inner signal conductor, a first outer signal conductor and a second outer signal conductor;
a second inner signal conductor, a third outer signal conductor and a fourth outer signal conductor;
a switching matrix;
wherein:
(a) the first electronic block is configured to receive a single-ended input signal from the signal input and generate a first differential signal;
(b) the switching arrangement is configured to receive the first differential signal and to exhibit:
(i) a through state, wherein the switching matrix is configured to connect the first inner signal conductor to the second inner signal conductor, the first outer conductor to the third outer conductor and the second outer conductor to the fourth outer conductor, thereby configuring the switching arrangement to pass the first differential signal through; and
(ii) a changeover state, wherein the switching matrix is configured to connect the first inner signal conductor to both the third outer signal conductor and the fourth outer conductor, and to connect the second inner signal conductor to both the first outer signal conductor and the second outer signal conductor, thereby configuring the switching arrangement to generate a second differential signal being the first differential signal with a phase shift.

2. The electronic arrangement of claim 1, further comprising a second electronic block configured to receive the second differential signal and to generate a single-ended output signal at the signal output.

3. The electronic arrangement of claim 2, wherein the phase shift is nominally a 180° phase shift.

4. The electronic arrangement of claim 2, wherein signals on the first and the second outer signal conductors are substantially the same and signals on the third and the fourth outer signal conductors are substantially the same.

5. The electronic arrangement of claim 2, wherein the signal input and the signal output are 50Ω matched.

6. The electronic arrangement of claim 2, wherein the switching matrix comprises a through switch and two changeover switches.

7. The electronic arrangement of claim 6, wherein in the through state, the through switch is closed and the two changeover switches are open and wherein in the changeover state, the through switch is open and the two changeover switches are closed.

8. The electronic arrangement of claim 6 wherein the first changeover switch, the second changeover switch and the through switch comprise MOSFET devices.

9. The electronic arrangement of claim 8 implemented on silicon on insulator (SOI).

10. The electronic arrangement of claim 2, wherein the first electronic block comprises a first limited ground coplanar waveguide (LGCPW) and a first coplanar waveguide (CPW) connecting the signal input to the first LGCPW.

11. The electronic arrangement of claim 10, wherein:
the first inner signal conductor is a signal trace of a first limited ground coplanar waveguide (LGCPW);
the first outer conductor is a first limited ground plane of the first LGCPW;
the second outer conductor is a second limited ground plane of the first LGCPW.

12. The electronic arrangement of claim 11, wherein the second electronic block comprises a second LGCPW and a second CPW connecting the second LGCPW to the signal output.

13. The electronic arrangement of claim 12, wherein:
the second inner signal conductor is a signal trace of a second LGCPW;
the third outer conductor is a first limited ground plane of the second LGCPW; and
the fourth outer conductor a second limited ground plane of the second LGCPW.

14. The electronic arrangement of claim 13, wherein a characteristic impedance of one or more of a) the first CPW, b) the first LGCPW, c) the second LGCPW and d) the second CPW is 50Ω.

15. The electronic arrangement of claim 13, wherein:
a length of the first signal trace is larger than or equal to a fraction of an input signal wavelength; and
a length of the second signal trace is larger than or equal to a fraction of the input signal wavelength.

16. The electronic arrangement of claim 13 configured to operate at frequencies higher than or equal to 10 GHz.

17. The electronic arrangement of claim 13, wherein the first signal trace and the second signal trance are larger than or equal to $1/10^{th}$ of the input signal wavelength.

18. An electronic arrangement comprising:
a first transmission line configured to receive an input signal;
a second transmission line;
a first middle section comprising a first signal trace and first middle section ground planes;
a second middle section comprising a second signal trace and second middle section ground planes;
a switching matrix connecting the first middle section to the second middle section;
wherein:
(a) the first middle section ground planes are narrower than ground planes of the first transmission line;
(b) the second middle section ground planes are narrower than ground planes of the second transmission line;
(c) the first signal trace and the first middle section ground planes have substantially the same widths, and the first middle section ground planes have substantially the same spacing from the first signal trace;
(d) the second signal trace and the second middle section ground planes have substantially the same widths, and the second middle section ground planes have substantially the same spacing from the second signal trace; and
(e) the electronic arrangement is configured to exhibit:
(i) a through state, wherein the switching matrix is configured to connect the first signal trace to the second signal trace, the ground planes of the first transmission lines to the first middle section ground planes, the ground planes of the second transmission line to the second section ground planes, thereby configuring the electronic arrangement to pass the input signal through; and
(ii) a changeover state, wherein the switching matrix is configured to connect the first signal trace to the second middle section ground planes, and to connect the second signal trace to the first middle section ground planes, thereby configuring the electronic arrangement to create a phase shift to the input signal.

19. The electronic arrangement of claim 18, wherein the phase shift is a 180° phase shift.

20. A switching arrangement comprising:
a first inner signal conductor, a first outer conductor and a second outer conductor;
a second inner signal conductor, a third outer conductor and a fourth outer conductor;
a switching matrix;
a signal input; and
a signal output;
wherein:
(a) the switching arrangement is configured to receive a differential input signal from the signal input, and
(b) the switching arrangement is configured to exhibit a changeover state, wherein the switching matrix is configured to connect the first inner signal conductor to both the third outer conductor and the fourth outer conductor, and to connect the second inner signal conductor to both the first outer conductor and the second outer conductor, thereby configuring the switching arrangement to output a differential output signal to the signal output, the differential output signal being the differential input signal with a phase shift.

21. The switching arrangement of claim 20, wherein the switching arrangement is configured to exhibit a through state, wherein the switching matrix is configured to connect the first inner signal conductor to the second inner signal conductor, the first outer conductor to the third outer conductor and the second outer conductor to the fourth outer conductor, thereby configuring the switching arrangement to pass the differential input signal through.

* * * * *